US012648254B2

(12) United States Patent (10) Patent No.: US 12,648,254 B2
Lu et al. (45) Date of Patent: Jun. 2, 2026

(54) LIQUID-CARRYING ROLLER FOR WET ETCHING AND WET ETCHING METHOD

(71) Applicant: JA Solar Technology Yangzhou Co., Ltd., Yangzhou City (CN)

(72) Inventors: Lin Lu, Yangzhou City (CN); Bin Chen, Yangzhou City (CN); Yunlu Wang, Yangzhou City (CN)

(73) Assignee: JA Solar Technology Yangzhou Co., Ltd., Yangzhou City (CN)

( * ) Notice: Subject to any disclaimer, the term of this patent is extended or adjusted under 35 U.S.C. 154(b) by 581 days.

(21) Appl. No.: 18/028,598

(22) PCT Filed: Sep. 27, 2021

(86) PCT No.: PCT/CN2021/120998
§ 371 (c)(1),
(2) Date: Mar. 27, 2023

(87) PCT Pub. No.: WO2022/063301
PCT Pub. Date: Mar. 31, 2022

(65) Prior Publication Data
US 2023/0343888 A1 Oct. 26, 2023

(30) Foreign Application Priority Data
Sep. 28, 2020 (CN) .......................... 202011054898.2

(51) Int. Cl.
*H10F 71/00* (2025.01)
*H10P 72/00* (2026.01)
(52) U.S. Cl.
CPC ......... *H10F 71/00* (2025.01); *H10P 72/0426* (2026.01)

(58) Field of Classification Search
CPC .............................. H10F 71/00; H10P 72/0426
USPC .............................................................. 134/78
See application file for complete search history.

(56) References Cited

U.S. PATENT DOCUMENTS

2016/0254173 A1* 9/2016 Edgerly ........... H01L 21/67075
156/345.11

FOREIGN PATENT DOCUMENTS

| CN | 204118103 U | 1/2015 |
|----|-------------|--------|
| CN | 105592944 A | 5/2016 |
| CN | 111029289 A | 4/2020 |

(Continued)

OTHER PUBLICATIONS

CN111029289A—machine translation (Year: 2020).*

(Continued)

*Primary Examiner* — Tinsae B Ayalew
(74) *Attorney, Agent, or Firm* — Michael Best & Friedrich LLP

(57) ABSTRACT

The invention, which relates to a liquid-carrying roller for wet etching and a wet etching method, belongs to the technical field of solar cell manufacturing, and solves the problem of abnormal roller levelness in a process of manufacturing a solar cell in the prior art. The liquid-carrying roller for wet etching of the invention comprises a first end shaft, a second end shaft, and a liquid-carrying shaft, the first end shaft and the second end shaft being located at both ends of the liquid-carrying shaft, respectively, the first end shaft, the second end shaft and the liquid-carrying shaft being arranged concentrically, and the diameters of the first end shaft and the second end shaft being both adjustable.

18 Claims, 6 Drawing Sheets

(56) References Cited

FOREIGN PATENT DOCUMENTS

| CN | 112309913 A | 2/2021 | |
| WO | WO-2009129989 A1 * | 10/2009 | ....... H01L 21/67086 |

OTHER PUBLICATIONS

WO2009129989A1—machine translation (Year: 2009).*

International Search Report and Written Opinion for Application No. PCT/CN2021/120998, dated Dec. 30, 2021 (6 pages).

* cited by examiner 110          130                120

(a)                    (b)                    (c)

LIQUID-CARRYING ROLLER FOR WET ETCHING AND WET ETCHING METHOD

CROSS-REFERENCE TO RELATED APPLICATION(S)

This is a U.S. national stage entry of International Patent Application No. PCT/CN2021/120998, filed on Sep. 27, 2021, which claims priority to Chinese Patent Application No. 202011054898.2, filed on Sep. 28, 2020, the entire contents of each of which are fully incorporated herein by reference.

TECHNICAL FIELD

The invention relates to the technical field of solar cell manufacturing, and in particular relates to a liquid-carrying roller for wet etching and a wet etching method.

BACKGROUND

In recent years, production technology of solar cell sheets has been continuously improved, production costs have been continuously reduced, and cell efficiency has been continuously increased, so an application of photovoltaic power generation becomes increasingly popular and develops rapidly, and gradually becomes an important source of power supply. An etching is an important process for preparing silicon solar cell sheets, and aims to remove PN junctions and phosphorosilicate glass on a front of a cell, and etching quality directly affects conversion efficiency of a cell sheet. The current etching methods for silicon wafers mainly include dry etching and wet etching, wherein the production process of the wet etching is as follows: as for a silicon solar cell sheet that has been subjected to diffusion, a mixed acid solution of $HNO_3$ and HF in an etching tank is used to etch the lower surface and edge of the silicon wafer so as to achieve edge insulation.

The existing wet etching process is usually formed by connecting a series of tank modules, which are sequentially etching tank→water washing tank 1→alkali tank→water washing tank 2→acid tank→water washing tank 3→drying. At present, most of wet etching devices suitable for the wet etching process adopt a roller transmission manner, and on the wet etching device, shafts at both ends of a liquid-carrying roller are generally directly inserted into bracket holes to achieve the rotation of the roller to thereby achieve transfer of a silicon wafer from loading to unloading. After long-term use, the diameter of the roller will become small due to wear, which results in that the running silicon wafer cannot move horizontally during transportation, and affects the etching quality of the solar cell sheet; meanwhile, a water film covering the upper surface of the silicon wafer will also slide into a chemical solution due to the unevenness of the rollers, which results in abnormal concentration, and will also affect the etching effect. Deviations of machining precision of a bracket and machining precision of rollers of an etching tank will cause abnormalities in levelness of individual rollers, and affect the overall etching effect.

SUMMARY

In view of the aforesaid analysis, embodiments of the invention aim to provide a liquid-carrying roller for wet etching and a wet etching method for solving the problem of abnormal roller levelness in a process of manufacturing a solar cell in the prior art.

On the one hand, the invention provides a liquid-carrying roller for wet etching, comprising a first end shaft, a second end shaft, and a liquid-carrying shaft, the first end shaft and the second end shaft being located at both ends of the liquid-carrying shaft, respectively, the first end shaft, the second end shaft and the liquid-carrying shaft being arranged concentrically, and the diameters of the first end shaft and the second end shaft being both adjustable.

Further, the first end shaft includes a plurality of first wedges, a plurality of second wedges, a first brake, a second brake, and a first central shaft.

Further, the first brake and the second brake are both sleeved on the first central shaft, the first brake is connected to the first wedges, the second brake is connected to the second wedges, and one end of the first central shaft is connected to the central hole of the liquid-carrying shaft.

Further, the second end shaft includes a plurality of third wedges, a plurality of fourth wedges, a third brake, a fourth brake, and a second central shaft.

Further, the third brake and the fourth brake are both sleeved on the second central shaft, the third brake is connected to the third wedges, the fourth brake is connected to the fourth wedges, and one end of the second central shaft is connected to the central hole of the liquid-carrying shaft.

Further, the first wedges and the second wedges are arranged alternately, the side surfaces of the first wedges are always in contact with the side surfaces of the second wedges, the third wedges and the fourth wedges are arranged alternately, and the side surfaces of the third wedges are always in contact with the side surfaces of the fourth wedges.

Further, the first brake and the second brake can move oppositely along the first central shaft.

Further, the first wedges can move in the radial direction of the first brake, and the second wedges can move in the radial direction of the second brake.

Further, the third brake and the fourth brake can move oppositely along the second central shaft.

Further, the third wedges can move in the radial direction of the third brake, and the fourth wedges can move in the radial direction of the fourth brake.

Further, the first wedges and the second wedges define a first outer surface forming the first end shaft; the third wedges and the fourth wedges define a second outer surface forming the second end shaft.

Further, the first outer surface has a first effective diameter, which increases or decreases in accordance with an axial movement between the first wedges and the second wedges; the second outer surface has a second effective diameter, which increases or decreases in accordance with an axial movement between the third wedges and the fourth wedges.

Further, the material of the first end shaft, the second end shaft and the liquid-carrying shaft is PVDF or PTFE.

On the other hand, the invention provides a wet etching method, the aforesaid liquid-carrying roller for wet etching being used, the method comprising:

step 1: adjusting the shaft ends of the liquid-carrying rollers to make a solar wafer be in a horizontal state; moving the brakes towards each other to make the wedges move towards the center of the cylinder of the end shaft, with the diameter of the end shaft increasing; moving the brakes away from each other to make the wedges move away from the center of the cylinder of the end shaft, with the diameter of the end shaft decreasing;

step 2: driving the solar wafer to move by the liquid-carrying rollers, and performing wet etching.

As compared with the prior art, the invention may achieve at least one of the following advantageous effects:

(1) The diameters of the first end shaft and the second end shaft may be adjusted, and when abnormal roller levelness is resulted in due to wear of the both ends of the liquid-carrying roller or machining precision of an etching tank, the sizes of the both ends of the separate liquid-carrying roller may be adjusted in real time to ensure horizontal placement of the liquid-carrying roller on the bracket, which can greatly reduce operating costs of a wet etching device while guaranteeing quality during solar cell etching.

(2) The first wedges and the second wedges are arranged on the first brake and the second brake, respectively, the first brake and the second brake can move oppositely along the first central shaft, the first wedges and the second wedges can move in the radial direction relative to the first brake and the second brake, thereby achieving a change in the diameter of the first end shaft, and the diameter of the second end shaft is adjusted in a manner the same as that of the first end shaft.

(3) The brake includes a connecting seat and telescopic rods, the connecting seat is sleeved on the central shaft, one end of the telescopic rod is connected vertically to the connecting seat in the radial direction of the connecting seat, the other end of the telescopic rod is a free end connected to the wedge, and the free end is telescopic relative to the connecting seat so as to make the wedge telescopic in the radial direction of the brake, which achieves the diameter adjustment of the end shaft of the liquid-carrying roller.

In the invention, the aforesaid technical solutions may be also combined with each other to achieve more preferred combination solutions. Other features and advantages of the invention will be illustrated in the Description that follows, and some advantages may be obvious in the Description, or may be understood by carrying out the invention. The object and other advantages of the invention may be achieved and obtained by the contents particularly mentioned in the Description and the Drawings.

Further effects of the aforesaid non-conventional optional manners will be described below in combination with specific implementation modes.

BRIEF DESCRIPTION OF THE DRAWINGS

Figures are only used to show objects of specific embodiments, and are not considered as limitations of the invention. In all of the figures, the same reference sign expresses the same component.

REFERENCE SIGNS

Figure 1:
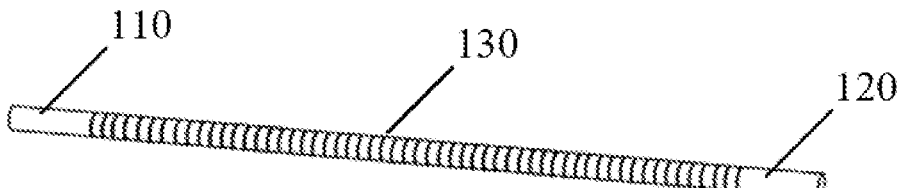
FIG. 1 is a schematic structural diagram of a liquid-carrying roller of the invention.
Figure 2:
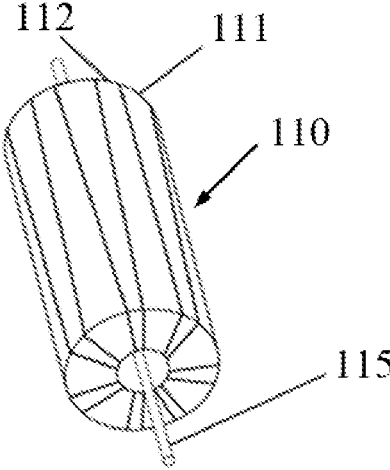
FIG. 2 is a schematic structural diagram of a first end shaft of the invention in an initial state.
Figure 3:
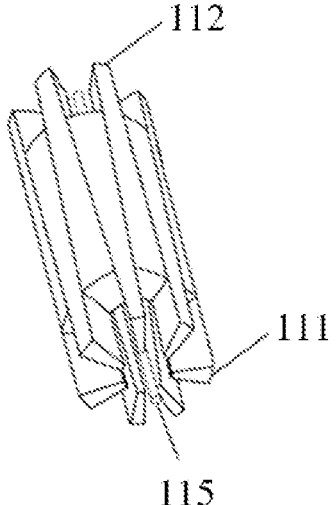
FIG. 3 is a schematic structural diagram of the first end shaft of the invention after the diameter thereof is adjusted to a larger one.
Figure 4:
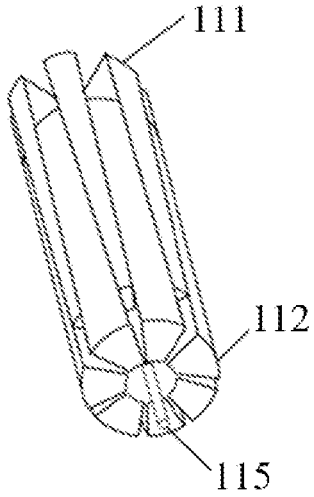
FIG. 4 is a schematic structural diagram of the first end shaft of the invention after the diameter thereof is adjusted to a smaller one.

100—liquid-carrying roller; 110—first end shaft; 111—first wedge; 112—second wedge; 113—first brake; 114—second brake; 115—second central shaft; 120—second end shaft; 121—third wedge; 122—fourth wedge; 123—third brake; 124—fourth brake; 125—second central shaft; 130—liquid-carrying shaft; 200—bracket; 210—bracket body; 220—installation hole; 300—solar wafer; 400—water film; 500—etching tank; 600—etching liquid.

DETAILED DESCRIPTION

The preferred embodiments of the invention are described in detail below in combination with the figures, where the figures, which form part of the invention, are used together with the embodiments of the invention for illustrating the principle of the invention, and are not used for limiting the scope of the invention.

In the descriptions of the embodiments of the invention, it should be noted that unless otherwise specified and limited, the term "connect" should be understood in a broad sense, for example, it may be a fixed connection, a detachable connection, an integral connection, a mechanical connection, an electrical connected, a direct connection, or an indirect connection via an intermediate medium. Those skilled in the art may understand the specific meaning of the aforesaid term in the invention according to specific conditions.

The terms "top", "bottom", "above . . . ", "lower" and "on . . . " used throughout the descriptions refer to positions relative to the components of the apparatus, such as relative positions of top and bottom substrates inside the apparatus. It may be understood that the apparatus is multifunctional independent of the orientations of the components in the space.

Embodiment 1

A specific embodiment of the invention, as shown in FIG. 1-FIG. 12, discloses a liquid-carrying roller for wet etching, comprising a first end shaft 110, a second end shaft 120, and a liquid-carrying shaft 130, the first end shaft 110 and the second end shaft 120 being located at both ends of the liquid-carrying shaft 130, respectively, the first end shaft 110, the second end shaft 120 and the liquid-carrying shaft 130 being arranged concentrically, and the diameters of the first end shaft 110 and the second end shaft 120 being both adjustable.

As compared with that in the prior art, when abnormal roller levelness is resulted in due to wear of the both ends of the liquid-carrying roller for wet etching provided by the embodiment or machining precision of an etching tank, the diameters of the both ends of the separate liquid-carrying roller may be adjusted in real time to ensure horizontal placement of the liquid-carrying roller on the bracket, which can greatly reduce operating costs of a wet etching device while guaranteeing quality during solar cell etching.

In the embodiment, the first end shaft 110 and the second end shaft 120 are collectively referred to as the end shaft, the first brake 113, the second brake 114, the third brake 123 and the fourth brake 124 are collectively referred to as the brake, and the first wedge 111, the second wedge 112, the third wedge 121 and the fourth wedge 122 are collectively referred to as the wedge.

The first end shaft 110 includes a plurality of first wedges 111, a plurality of second wedges 112, a first brake 113, a second brake 114, and a first central shaft 115, the first brake 113 and the second brake 114 are both sleeved on the first central shaft 115, the first brake 113 is connected to the first wedges 111, the second brake 114 is connected to the second wedges 112, the first central shaft 115 is connected to the central hole of the liquid-carrying shaft 130, and one end of the first central shaft 115 is provided with a first stopper, which is a regular hexahedron structure and is arranged in the central hole of the liquid-carrying shaft 130 to limit rotation of the first end shaft 110 relative to the liquid-carrying shaft 130.

The first wedge 111 is composed of a first arc surface, a second arc surface, two non-parallel side surfaces and two parallel end surfaces, the second wedge 112 is composed a third arc surface, a fourth arc surface, two non-parallel side surfaces and two parallel end surfaces, the first arc surfaces of the first wedges 111 and the third arc surfaces of the second wedges 112 form the outer circumference of the first end shaft 110, and the side surfaces of the first wedges 111 and the side surfaces of the second wedges 112 that are adjacent are in close contact with each other.

It should be noted that the first arc surfaces are concentric with the second arc surfaces, and the third arc surfaces are concentric with the fourth arc surfaces, so that the outer circumferential surface formed by the first end shaft 110 is a cylindrical surface, which prevents the first end shaft 110 from forming a linear contact with an installation hole 220 of a bracket 200 of a wet etching tank after being assembled therewith.

In order to achieve that the diameter of the first end shaft 110 may be adjusted, the first brake 113 and the second brake 114 are slidably connected to the first central shaft 115.

To be specific, the first brake 113 includes first telescopic rods and a first connecting seat, the first connecting seat is cylindrical and is sleeved on the outside of the first central shaft 115, and the diameter of the inner hole of the first connecting seat is equal to the diameter of the first central shaft 115, so that the first connecting seat can move on the first central shaft 115 under an action of an external force.

In the embodiment, the action of the external force that enables the first brake 113 to move relative to the first central shaft 115 is that an operator manually moves the first brake 113, so that the first brake 113 can be stopped at a desired position to make the diameter of the first end shaft 110 be of a diameter size required for the adjustment to the horizontal state.

The first telescopic rods are evenly distributed on the outer circumference of the first connecting seat, one end of the first telescopic rod is connected to the first connecting seat, and the other end thereof is a free end, which is telescopic relative to the fixed end. To be specific, the second arc surface of the first wedge 111 is provided with a first installation hole, which is arranged at an end close to the big end of the first wedge 111, and the free end of the first telescopic rod is installed in the first installation hole.

To be specific, the first telescopic rod includes a first telescopic spring, a first inner telescopic rod and a first connecting rod, one end of the first connecting rod is provided with a hole and a cavity is formed in the first connecting rod, the first telescopic spring is arranged in the cavity, the other end of the first connecting rod is fixedly connected to the first connecting seat, one end of the first inner telescopic rod enters the cavity through the hole in the first connecting rod and presses against the first telescopic spring, and the other end of the first inner telescopic rod is connected to the first wedge 111.

It should be noted that the extension line of the fixed end of the first telescopic rod passes through the axis center of the first connecting seat, that is, the first telescopic rod is arranged vertically in the radial direction of the first connecting seat.

The second brake 114 includes second telescopic rods and a second connecting seat, the second connecting seat is cylindrical and is sleeved on the outside of the first central shaft 115, and the diameter of the inner hole of the second connecting seat is equal to the diameter of the first central shaft 115, so that the second connecting seat can move on the first central shaft 115 under an action of an external force.

In the embodiment, the action of the external force that enables the second brake 114 to move relative to the first central shaft 115 is that an operator manually moves the second brake 114, so that the second brake 114 can be stopped at a desired position to make the diameter of the first end shaft 110 be of a diameter size required for the adjustment to the horizontal state.

The second telescopic rods are evenly distributed on the outer circumference of the second connecting seat, one end of the second telescopic rod is connected to the second connecting seat, and the other end thereof is a free end, which is telescopic relative to the fixed end. To be specific, the fourth arc surface of the second wedge 112 is provided with a second installation hole, which is arranged at an end close to the big end of the second wedge 112, and the free end of the second telescopic rod is installed in the second installation hole.

To be specific, the second telescopic rod includes a second telescopic spring, a second inner telescopic rod and a second connecting rod, one end of the second connecting rod is provided with a hole and a cavity is formed in the second connecting rod, the second telescopic spring is arranged in the cavity, the other end of the second connecting rod is fixedly connected to the second connecting seat, one end of the second inner telescopic rod enters the cavity through the hole in the second connecting rod and presses against the second telescopic spring, and the other end of the second inner telescopic rod is connected to the second wedge 112.

In the embodiment, the first telescopic rods are automatically telescopic along with the movement of the first brake 113, and the second telescopic rods are automatically telescopic along with the movement of the second brake 114. Since the side surfaces of the first wedges 111 and the second wedges 112 are in contact with each other, the telescopic amounts of the first telescopic rods and the second telescopic rods can be defined under acting forces of the first wedges 111 and the second wedges 112, that is, when the positions of the first brake 113 and the second brake 114 are fixed, the first telescopic rods and the second telescopic rods can maintain a specific length under actions of pressing forces of the side surfaces of the first wedges 111 and the second wedges 112.

It should be noted that the second telescopic rods are in the diameter directions of the second connecting seat.

It should be noted that the external force that causes the first brake 113 and the second brake 114 to move relative to the first central shaft 115 is not limited to a manual operation, and any driving manner that can make the first brake 113 and the second brake 114 move relative to the first central shaft 115 is allowed.

In the embodiment, the first brake 113 controls the movement of the first wedges 111, and the second brake 114 controls the movement of the second wedges 112. When the first end shaft 110 is worn, which causes the diameter of the first end shaft 110 to decrease, under the actions of the first telescopic rods and the second telescopic rods, the first wedges 111 and the second wedges 112 move outwards in the radial direction of the first end shaft 110, and the first brake 113 and the second brake 114 are manually moved, so that the first brake 113 and the second brake 114 move oppositely along the first central shaft 115, the side surfaces of the first wedges 111 are in close contact with the side surfaces of the second wedges 112, and the first arc surfaces of the first wedges 111 and the third arc surfaces of the second wedges 112 form the outer circumference of the first end shaft 110 having a new diameter.

The second end shaft 120 includes a plurality of third wedges 121, a plurality of fourth wedges 122, a third brake 123, a fourth brake 124, and a second central shaft 125, the third brake 123 and the fourth brake 124 are both sleeved on the second central shaft 125, the third brake 123 is connected to the third wedges 121, the fourth brake 124 is connected to the fourth wedges 122, the second central shaft 125 is connected to the central hole of the liquid-carrying shaft 130, and one end of the second central shaft 125 is provided with a second stopper, which is a regular hexahedron structure and is arranged in the central hole of the liquid-carrying shaft 130 to limit rotation of the second end shaft 120 relative to the liquid-carrying shaft 130.

The third wedge 121 is composed of a fifth arc surface, a sixth arc surface, two non-parallel side surfaces and two parallel end surfaces, the fourth wedge 122 is composed of a seventh arc surface, an eighth arc surface, two non-parallel side surfaces and two parallel end surfaces, the fifth arc surfaces of the third wedges 121 and the seventh arc surfaces of the fourth wedges 122 form the outer circumference of the second end shaft 120, and the side surfaces of the third wedges 121 and the side surfaces of the fourth wedges 122 that are adjacent are in close contact with each other.

It should be noted that the fifth arc surfaces are concentric with the sixth arc surfaces, and the seventh arc surfaces are concentric with the eighth arc surfaces, so that the outer circumferential surface formed by the second end shaft 120 is a cylindrical surface, which prevents the second end shaft 120 from forming a linear contact with the installation hole 220 of the bracket 200 of the wet etching tank after being assembled therewith.

In order to achieve that the diameter of the second end shaft 120 may be adjusted, the third brake 123 and the fourth brake 124 are slidably connected to the second central shaft 125.

To be specific, the third brake 123 includes third telescopic rods and a third connecting seat, the third connecting seat is cylindrical and is sleeved on the outside of the second central shaft 125, and the diameter of the inner hole of the third connecting seat is equal to the diameter of the second central shaft 125, so that the third connecting seat can move on the second central shaft 125 under an action of an external force.

In the embodiment, the action of the external force that enables the third brake 123 to move relative to the second central shaft 125 is that an operator manually moves the third brake 123, so that the third brake 123 can be stopped at a desired position to make the diameter of the second end shaft 120 be of a diameter size required for the adjustment to the horizontal state.

The third telescopic rods are evenly distributed on the outer circumference of the third connecting seat, one end of the third telescopic rod is connected to the third connecting seat, and the other end thereof is a free end, which is telescopic relative to the fixed end. To be specific, the sixth arc surface of the third wedge 121 is provided with a third installation hole, which is arranged at an end close to the big end of the third wedge 121, and the free end of the third telescopic rod is installed in the third installation hole.

To be specific, the third telescopic rod includes a third telescopic spring, a third inner telescopic rod and a third connecting rod, one end of the third connecting rod is provided with a hole and a cavity is formed in the third connecting rod, the third telescopic spring is arranged in the cavity, the other end of the third connecting rod is fixedly connected to the third connecting seat, one end of the third inner telescopic rod enters the cavity through the hole in the third connecting rod and presses against the third telescopic spring, and the other end of the third inner telescopic rod is connected to the third wedge 121.

It should be noted that the third telescopic rods are in the diameter directions of the second connecting seat.

Similarly, it may be known that the fourth brake 124 includes fourth telescopic rods and a fourth connecting seat, the fourth connecting seat is cylindrical and is sleeved on the outside of the second central shaft 125, and the diameter of the inner hole of the fourth connecting seat is equal to the diameter of the second central shaft 125, so that the fourth connecting seat can move on the second central shaft 125 under an action of an external force.

In the embodiment, the action of the external force that enables the fourth brake 124 to move relative to the second central shaft 125 is that an operator manually moves the fourth brake 124, so that the fourth brake 124 can be stopped at a desired position to make the diameter of the second end shaft 120 be of a diameter size required for the adjustment to the horizontal state.

The fourth telescopic rods are evenly distributed on the outer circumference of the fourth connecting seat, one end of the fourth telescopic rod is connected to the fourth connecting seat, and the other end thereof is a free end, which is telescopic relative to the fixed end. To be specific, the eighth arc surface of the fourth wedge 122 is provided with a fourth installation hole, which is arranged at an end close to the big end of the fourth wedge 122, and the free end of the fourth telescopic rod is installed in the fourth installation hole.

To be specific, the fourth telescopic rod includes a fourth telescopic spring, a fourth inner telescopic rod and a fourth connecting rod, one end of the fourth connecting rod is provided with a hole and a cavity is formed in the fourth connecting rod, the fourth telescopic spring is arranged in the cavity, the other end of the fourth connecting rod is fixedly connected to the fourth connecting seat, one end of the fourth inner telescopic rod enters the cavity through the hole in the fourth connecting rod and presses against the fourth telescopic spring, and the other end of the fourth inner telescopic rod is connected to the fourth wedge 122.

In the embodiment, the third telescopic rods are automatically telescopic along with the movement of the third brake 123, and the fourth telescopic rods are automatically telescopic along with the movement of the fourth brake 124. Since the side surfaces of the third wedges 121 and the fourth wedges 122 are in contact with each other, the telescopic amounts of the third telescopic rods and the fourth telescopic rods can be defined under acting forces of the third wedges 121 and the fourth wedges 122, that is, when the positions of the third brake 123 and the fourth brake 124 are fixed, the third telescopic rods and the fourth telescopic rods can maintain a specific length under actions of pressing forces of the side surfaces of the third wedges 121 and the fourth wedges 122.

It should be noted that the fourth telescopic rods are in the diameter directions of the fourth connecting seat.

It should be noted that the external force that causes the third brake 123 and the fourth brake 124 to move relative to the second central shaft 125 is not limited to a manual operation, and any driving manner that can make the third brake 123 and the fourth brake 124 move relative to the second central shaft 125 is allowed.

Figure 5:
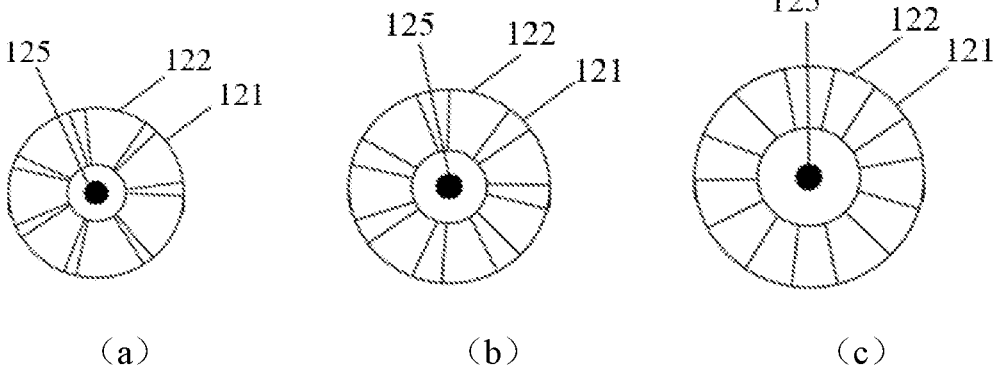
FIG. 5 is a schematic diagram of a diameter adjustment and change of a second end shaft of the invention.
Figure 6:
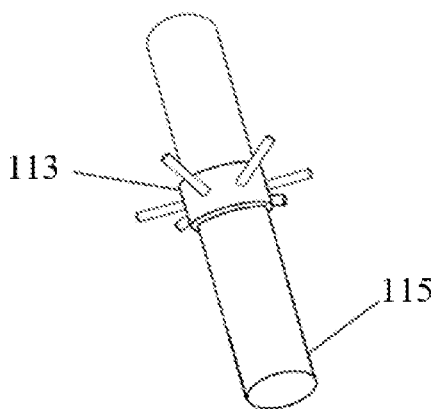
FIG. 6 is a schematic diagram of a connection between a first brake and a first central shaft of the invention.
Figure 7:
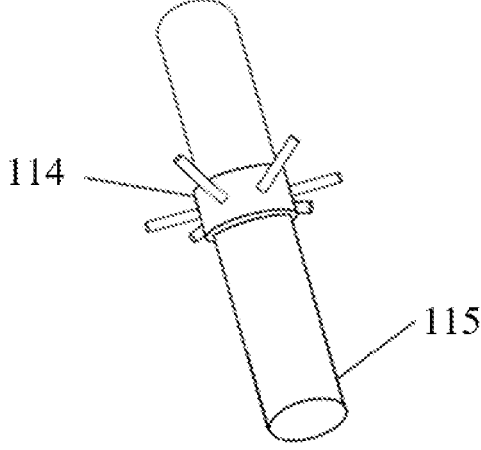
FIG. 7 is a schematic diagram of a connection between a second brake and the first central shaft of the invention.
Figure 8:
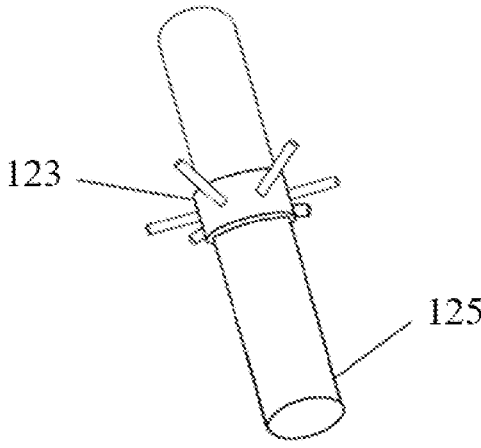
FIG. 8 is a schematic diagram of a connection between a third brake and a second central shaft of the invention.
Figure 9:
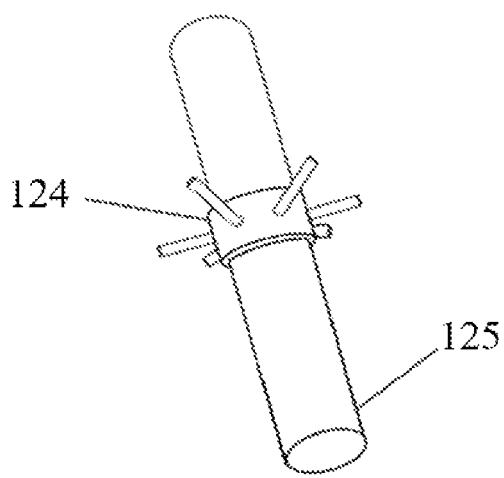
FIG. 9 is a schematic diagram of a connection between a fourth brake and the second central shaft of the invention.
Figure 10:
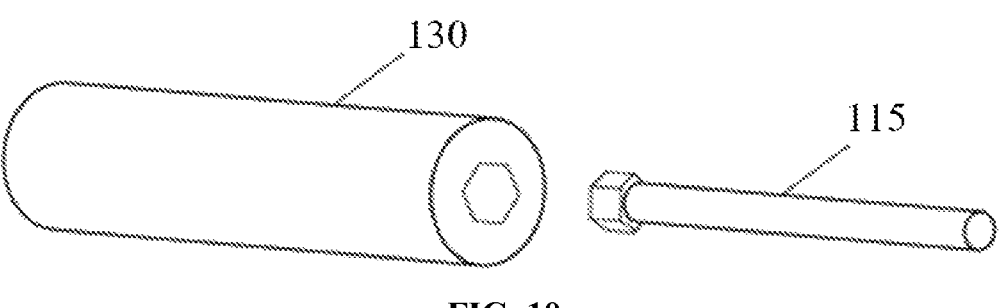
FIG. 10 is an exploded schematic view of the liquid-carrying shaft and the first central shaft of the invention.
Figure 11:
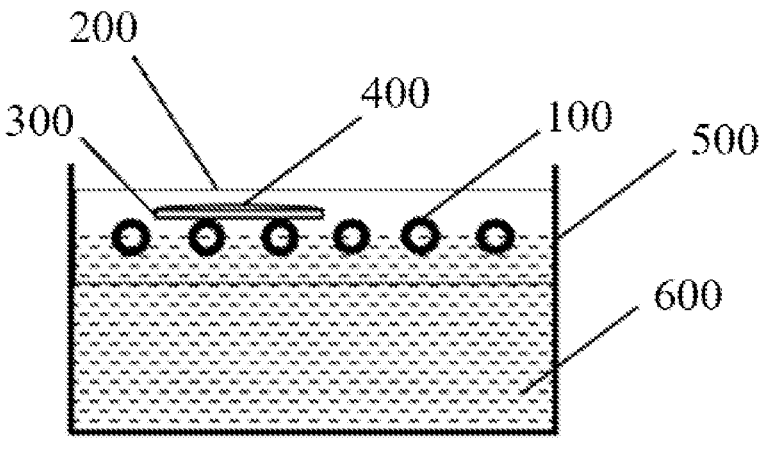
FIG. 11 is a schematic structural view of a wet etching tank of the invention.
Figure 12:
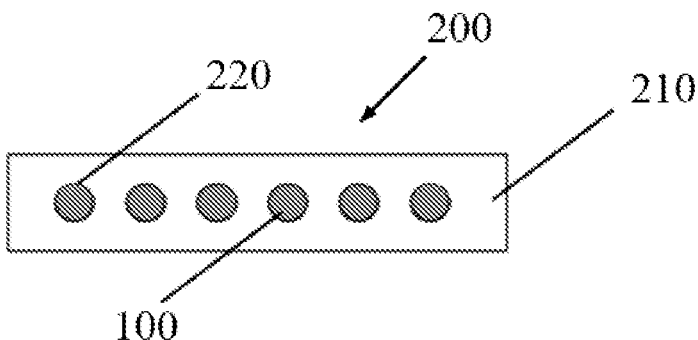
FIG. 12 is a schematic cross-sectional view of a connection between the liquid-carrying roller and a bracket of the invention.

In the embodiment, the third brake 123 controls the movement of the third wedges 121, and the fourth brake 124 controls the movement of the fourth wedges 122. When the second end shaft 120 is worn, which causes the diameter of the second end shaft 120 to decrease, under the actions of the third telescopic rods and the fourth telescopic rods, the third wedges 121 and the fourth wedges 122 move outwards in the radial direction of the second end shaft 120, and the third brake 123 and the fourth brake 124 are manually moved, so that the third brake 123 and the fourth brake 124 move oppositely along the second central shaft 125, the side surfaces of the third wedges 121 are in close contact with the side surfaces of the fourth wedges 122, and the fifth arc surfaces of the third wedges 121 and the seventh arc surfaces of the fourth wedges 122 form the outer circumference of the second end shaft 120 having a new diameter. As shown in FIG. 5, FIG. 5(a) is a schematic diagram of a change that the diameter of the second end shaft 120 is adjusted to a smaller one from the initial position, FIG. 5(b) is a schematic diagram that the diameter of the second end shaft 120 is in the initial state, and FIG. 5(c) is a schematic diagram of a change that the diameter of the second end shaft 120 is adjusted to a larger one.

It should be noted that in order to reduce manufacturing costs, the first end shaft 110 and the second end shaft 120 have the same size and structure.

It should be noted that the first wedges 111 and the second wedges 112 define a first outer surface forming the first end shaft 110 (composed of the first arc surfaces of the first wedges 111 and the third arc surfaces of the second wedges), the first outer surface has a first effective diameter, which increases or decreases in accordance with an axial movement between the first wedges 111 and the second wedges 112 (that is, the first wedges 111 and the second wedges 112 move towards each other along the first central shaft 124, with the first effective diameter increasing, and the first wedges 111 and the second wedges 112 move away from each other along the first central shaft 115, with the first effective diameter decreasing); the third wedges 121 and the fourth wedges 122 define a second outer surface forming the second end shaft 120 (composed of the fifth arc surfaces of the third wedges 121 and the seventh arc surfaces of the fourth wedges 122), the second outer surface has a second effective diameter, which increases or decreases in accordance with an axial movement between the third wedges 121 and the fourth wedges 122 (that is, the third wedges 121 and the fourth wedges 122 move towards each other along the second central shaft 125, with the second effective diameter increasing, and the third wedges 121 and the fourth wedges 122 move away from each other along the second central shaft 125, with the second effective diameter decreasing).

Since the material of the roller must be an acid- and alkali-resistant material, the material of the first end shaft 110, the second end shaft 120 and the liquid-carrying shaft 130 is PVDF (Poly vinylidene fluoride) or PTFE (Poly tetra fluoroethylene).

The liquid-carrying roller 100 in the embodiment is applied to a wet etching tank. An etching tank 500 comprises the bracket 200 and the liquid-carrying rollers 100, an etching liquid 600 is provided in the etching tank 500, a solar wafer 300 is arranged on the liquid-carrying rollers 100, the upper surface of the solar wafer 300 is provided with a water film 400, and liquid-carrying rollers 100 are connected to the bracket 200. To be specific, the bracket 200 includes a bracket body 210, which is evenly provided with installation holes 220, and the first end shafts 110 and the second end shafts 120 of the liquid-carrying rollers 100 are arranged in the installation holes 220 of the bracket body 210 on both sides of the bracket 200, respectively.

In the embodiment, when the friction between the liquid-carrying roller 100 and the bracket 200 causes wear, it is not required to replace the entire liquid-carrying roller 100, and it is only required to adjust the diameters of the end shafts, which reduces the operating costs of the etching tank 500. In addition, levelness of the liquid-carrying roller 100 may be adjusted independently.

Embodiment 2

Another specific embodiment of the invention discloses a wet etching method, the liquid-carrying roller for wet etching of Embodiment 1 being used, the method comprising:

Step 1: The shaft ends of the liquid-carrying rollers 100 are adjusted to ensure that a solar wafer 300 is in a horizontal state when being placed on the liquid-carrying rollers 100.

It should be noted that a plurality of liquid-carrying rollers 100 are installed in the etching tank 500, and it is required to adjust all of the liquid-carrying rollers 100 so that the solar wafer 300 is in a horizontal position.

The first brake 113 and the second brake 114 are moved towards each other to make the first wedges 111 and the second wedges 112 move towards the center of the cylinder of the first end shaft 110, with the diameter of the first end shaft 110 increasing; the third brake 123 and the fourth brake 124 are moved towards each other to make the third wedges 121 and the fourth wedges 122 move towards the center of the cylinder of the second end shaft 120, with the diameter of the second end shaft 120 increasing;

the first brake 113 and the second brake 114 are moved away from each other to make the first wedges 111 and the second wedges 112 move away from the center of the cylinder of the first end shaft 110, with the diameter of the first end shaft 110 decreasing; the third brake 123 and the fourth brake 124 are moved away from each other to make the third wedges 121 and the fourth wedges 122 move away from the center of the cylinder of the second end shaft 120, with the diameter of the second end shaft 120 decreasing.

Step 2: The solar wafer 300 is placed on the liquid-carrying rollers 100, which rotate under an action of an external force (such as a motor) to brush the etching liquid 600 on the back of the solar wafer 300 for wet etching while driving the solar wafer 300 to move forwards.

It should be noted that since the front of the solar wafer 300 is provided with the water film 400, damage to the front of the solar wafer 300 by the etching liquid 600 is avoided.

The above contents are only preferred specific implementation modes of the invention, but the scope of protection of the invention is not limited thereto. Any change or substitution that can be easily conceived by those skilled in the art within the technical scope disclosed in the invention shall be included in the scope of protection of the invention.

The invention claimed is:

1. A liquid-carrying roller for wet etching, characterized in that the roller comprises a first end shaft (110), a second end shaft (120), and a liquid-carrying shaft (130), the first end shaft (110) and the second end shaft (120) being located at both ends of the liquid-carrying shaft (130), respectively, the first end shaft (110), the second end shaft (120) and the liquid-carrying shaft (130) being arranged concentrically, and the diameters of the first end shaft (110) and the second end shaft (120) being both manually adjustable.

2. The liquid-carrying roller for wet etching of claim 1, characterized in that the first end shaft (110) includes a plurality of first wedges (111), a plurality of second wedges (112), a first brake (113), a second brake (114), and a first central shaft (115); the first brake (113) and the second brake (114) are both sleeved on the first central shaft (115), the first brake (113) is connected to the first wedges (111), the second brake (114) is connected to the second wedges (112), and one end of the first central shaft (115) is connected to a central hole of the liquid-carrying shaft (130).

3. The liquid-carrying roller for wet etching of claim 2, characterized in that the second end shaft (120) includes a plurality of third wedges (121), a plurality of fourth wedges (122), a third brake (123), a fourth brake (124), and a second central shaft (125); the third brake (123) and the fourth brake (124) are both sleeved on the second central shaft (125), the third brake (123) is connected to the third wedges (121), the fourth brake (124) is connected to the fourth wedges (122), and one end of the second central shaft (125) is connected to the central hole of the liquid-carrying shaft (130).

4. The liquid-carrying roller for wet etching of claim 2, characterized in that the first brake (113) and the second brake (114) can move oppositely along the first central shaft (115).

5. The liquid-carrying roller for wet etching of claim 2, characterized in that the first wedges (111) can move in the radial direction of the first brake (113), and the second wedges (112) can move in the radial direction of the second brake (114).

6. The liquid-carrying roller for wet etching of claim 3, characterized in that the third brake (123) and the fourth brake (124) can move oppositely along the second central shaft (125).

7. The liquid-carrying roller for wet etching of claim 3, characterized in that the third wedges (121) can move in the radial direction of the third brake (123), and the fourth wedges (122) can move in the radial direction of the fourth brake (124).

8. The liquid-carrying roller for wet etching of claim 3, characterized in that the first wedges (111) and the second wedges (112) define a first outer surface forming the first end shaft (110);

the third wedges (121) and the fourth wedges (122) define a second outer surface forming the second end shaft (120).

9. The liquid-carrying roller for wet etching of claim 1, characterized in that the material of the first end shaft (110), the second end shaft (120) and the liquid-carrying shaft (130) is PVDF or PTFE.

10. The liquid-carrying roller for wet etching of claim 3, characterized in that the first wedges (111) and the second wedges (112) are arranged alternately, the side surfaces of the first wedges (111) are always in contact with the side surfaces of the second wedges (112), the third wedges (121) and the fourth wedges (122) are arranged alternately, and the side surfaces of the third wedges (121) are always in contact with the side surfaces of the fourth wedges (122).

11. The liquid-carrying roller for wet etching of claim 3, characterized in that one end of the first central shaft (115) is provided with a first stopper, which is arranged in the central hole of the liquid-carrying shaft (130) to limit rotation of the first end shaft (110) relative to the liquid-carrying shaft (130);

one end of the second central shaft (125) is provided with a second stopper, which is arranged in the central hole of the liquid-carrying shaft (130) to limit rotation of the second end shaft (120) relative to the liquid-carrying shaft (130).

12. The liquid-carrying roller for wet etching of claim 2, characterized in that the first wedge (111) is composed of a first arc surface, a second arc surface, two non-parallel side surfaces and two parallel end surfaces, the second wedge (112) is composed a third arc surface, a fourth arc surface, two non-parallel side surfaces and two parallel end surfaces, the first arc surfaces of the first wedges (111) and the third arc surfaces of the second wedges (112) form the outer circumference of the first end shaft (110), and the side surfaces of the first wedges (111) and the side surfaces of the second wedges (112) that are adjacent are in close contact with each other.

13. The liquid-carrying roller for wet etching of claim 12, characterized in that the first arc surfaces are concentric with the second arc surfaces, and the third arc surfaces are concentric with the fourth arc surfaces, so that the outer circumferential surface formed by the first end shaft (110) is a cylindrical surface.

14. The liquid-carrying roller for wet etching of claim 3, characterized in that the third wedge (121) is composed of a fifth arc surface, a sixth arc surface, two non-parallel side surfaces and two parallel end surfaces, the fourth wedge (122) is composed of a seventh arc surface, an eighth arc surface, two non-parallel side surfaces and two parallel end surfaces, the fifth arc surfaces of the third wedges (121) and the seventh arc surfaces of the fourth wedges (122) form the outer circumference of the second end shaft (120), and the side surfaces of the third wedges (121) and the side surfaces of the fourth wedges (122) that are adjacent are in close contact with each other.

15. The liquid-carrying roller for wet etching of claim 14, characterized in that the fifth arc surfaces are concentric with the sixth arc surfaces, and the seventh arc surfaces are concentric with the eighth arc surfaces, so that the outer circumferential surface formed by the second end shaft (120) is a cylindrical surface.

16. The liquid-carrying roller for wet etching of claim 8, characterized in that the first outer surface has a first effective diameter, which increases or decreases in accordance with an axial movement between the first wedges (111) and the second wedges (112); the second outer surface has a second effective diameter, which increases or decreases 5 in accordance with an axial movement between the third wedges (121) and the fourth wedges (122).

17. A wet etching method, characterized in that the liquid-carrying roller for wet etching of claim 1 is used, the method comprising: 10 step 1: adjusting the shaft ends of the liquid carrying roller to make a solar wafer be in a horizontal state;

moving the brakes towards each other to make the wedges move towards the center of the cylinder of the end shaft, with the diameter of the end shaft increasing; 15 moving the brakes away from each other to make the wedges move away from the center of the cylinder of the end shaft, with the diameter of the end shaft decreasing;

step 2: driving the solar wafer to move by the liquid 20 carrying roller, and performing wet etching.

18. An etching tank applied to wet etching, characterized in that the etching tank comprises: a bracket (200) and the liquid-carrying roller (100) of claim 1, wherein the bracket (200) includes a bracket body (210), which is 25 evenly provided with installation holes (220), and the first end shaft (110) and the second end shaft (120) of the liquid carrying roller (100) are arranged in the installation holes (220) of the bracket body (210) on both sides of the bracket (200), respectively. 30

\* \* \* \* \*